United States Patent
Lam et al.

(10) Patent No.: US 6,180,456 B1
(45) Date of Patent: Jan. 30, 2001

(54) TRIPLE POLYSILICON EMBEDDED NVRAM CELL AND METHOD THEREOF

(75) Inventors: Chung Hon Lam, Williston; Glen L. Miles; Jame Spiros Nakos, both of Essex Junction; Christa R. Willets, Jericho, all of VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/251,661

(22) Filed: Feb. 17, 1999

(51) Int. Cl.⁷ .................................................. H01L 21/8247
(52) U.S. Cl. ............................................ 438/258; 438/264
(58) Field of Search ...................... 438/257–267

(56) References Cited

U.S. PATENT DOCUMENTS

| | | |
|---|---|---|
| 5,081,054 | 1/1992 | Wu et al. . |
| 5,086,008 | 2/1992 | Riva . |
| 5,254,489 | 10/1993 | Nakata . |
| 5,449,634 | 9/1995 | Inoue . |
| 5,538,912 | 7/1996 | Kunori et al. . |
| 5,587,332 | 12/1996 | Chang et al. . |
| 5,635,416 | 6/1997 | Chen et al. . |
| 5,656,527 | 8/1997 | Choi et al. . |
| 5,658,813 | 8/1997 | Enomoto . |
| 5,756,385 | 5/1998 | Yuan et al. . |
| 5,888,869 | * 3/1999 | Cho et al. .............................. 438/258 |
| 6,004,847 | * 12/1999 | Clementi et al. ..................... 438/258 |

FOREIGN PATENT DOCUMENTS

| | | |
|---|---|---|
| 0 379 449 A1 | 7/1990 | (EP) . |
| 0 892 430 A1 | 1/1999 | (EP) . |

* cited by examiner

Primary Examiner—Richard Booth
(74) Attorney, Agent, or Firm—McGuireWoods LLP; William D. Sabo

(57) ABSTRACT

A logic chip including a non-volatile random access memory (NVRAM) array and method of fabrication thereof. The chip includes devices with gates on one or more of three polysilicon layers. Chip logic uses normal FETs and array support includes high voltage FETs. Both logic and support are CMOS. The gates of normal FETs in the chip logic are from the third, uppermost polysilicon layer. The third poly silicon layer also is used as a mask for high voltage FETs and array word lines, both of which use the second polysilicon layer for gates. The first polysilicon layer is used solely for cell floating gates.

12 Claims, 10 Drawing Sheets

| PFET 114 | NFET 116 | HiV PFET 118 | HiV NFET 120 | EEPROM CELL 122 |

US 6,180,456 B1

TRIPLE POLYSILICON EMBEDDED NVRAM CELL AND METHOD THEREOF

BACKGROUND OF THE INVENTION

FIELD OF THE INVENTION

The present invention generally relates to non-volatile memory cells and more particularly to a three-dimensional, direct-write non-volatile random access memory (NVRAM) cell having a high integration density and fabrication methods thereof.

BACKGROUND DESCRIPTION

Non-volatile floating gate memory cells, such as in a non-volatile random access memory (NVRAM) arrays are well known in the industry. In NVRAM cells, the cell's conductive state is determined by the charge state of the cell's floating gate. The floating gate is an electrically isolated gate of a field effect transistor (FET) stacked in a two device NAND-like structure. Charge is forced onto or removed from the floating gate through a thin insulator layer that, normally (during a read operation), isolates the gate electrically from other adjoining conductive layers. Typically, a negatively charged floating gate is representative of a binary one state, while an uncharged floating gate is representative of a binary zero state. The other device in the NAND-like structure provides cell read and write selection.

For writing cells, a control gate (or program gate) is capacitively coupled to the floating gates in a portion of an array. A program voltage that is much higher than normal operating voltages, is placed on a control gate to bias the cell's floating gate sufficiently to change the charge on the cell's floating gate, i.e., to write selected cells.

However, typical program voltages, which range from 8–20 volts, are sufficiently high to destroy single gate FETs. Consequently, NVRAM chips require inclusion of special high voltage devices capable of handling these higher voltages without damage. Typical high voltage FETs have thicker gate oxides that are capable of withstanding the higher electric fields developed FETS by the presence of the programming voltage.

Typically, areas of the particular chip die were defined, lithographically. Unfortunately, exposing the thicker dielectric in these high voltage device areas to lithographic processing degraded the dielectric, causing failures, which degraded chip yield and, left residual contaminants that made these prior art devices less reliable.

Thus, there is a need for a semiconductor process for non-volatile memory wherein these gate oxide FETs may be included without degrading chip yield or reliability.

SUMMARY OF THE INVENTION

It is a purpose of the present invention to reduce NVRAM cell size, and therefore increase the number of NVRAM cells that may be included on a single integrated circuit chip.

The present invention is a logic chip including a non-volatile random access memory (NVRAM) array and method of fabrication thereof. The chip includes devices with gates on one or more of three polysilicon layers. Chip logic uses normal FETs and array support includes high voltage FETs. Both logic and support are CMOS. The gates of normal FETs in the chip logic are fashioned from the third or uppermost polysilicon layer. The third polysilicon layer also is used as a mask for high voltage FETs and array word lines, both of which use the second polysilicon layer for gates. The first polysilicon layer is used solely for cell floating gates.

BRIEF DESCRIPTION OF THE DRAWINGS

The foregoing and other objects, aspects and advantages will be ,better understood from the following detailed description of a preferred embodiment of the invention with reference to the drawings, in which.

DETAILED DESCRIPTION OF A PREFERRED EMBODIMENT OF THE INVENTION

Figure 1:
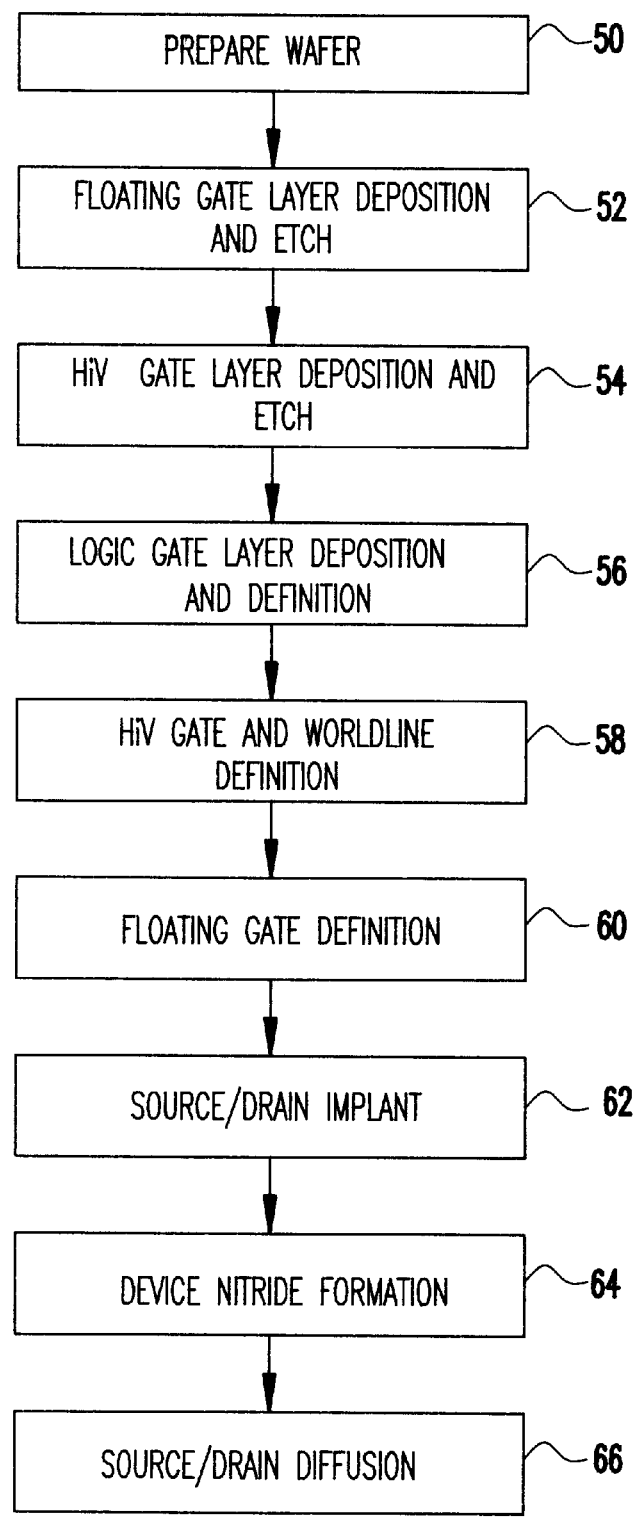
FIG. 1 is a flow diagram of the preferred embodiment triple polysilicon method of forming a preferred embodiment integrated circuit including logic with embedded EEPROM cells.

Referring now to the drawings, and more particularly to FIG. 1, which is a flow diagram of the preferred method of forming a triple polysilicon integrated circuit including logic with embedded EEPROM cells. High voltage (HiV) devices are included to interface between the chip logic and EEPROM cells. The HiV FETs are capable of withstanding the higher than normal voltage operating conditions experienced during an erase or write operation.

Figure 2A:
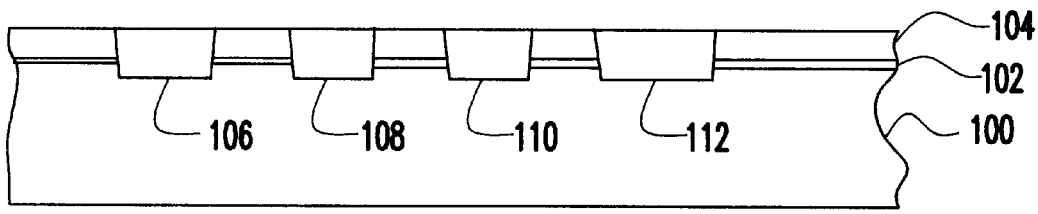
FIGS. 2A–D show the semiconductor wafer preparation step.
Figure 2B:
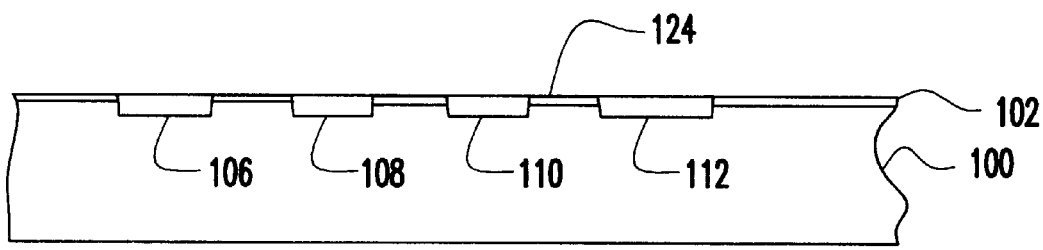

First, in step 50, as shown in cross-section in FIGS. 2A–D a semiconductor wafer 100, preferably silicon, is prepared. In FIG. 2A pad oxide 102 and pad nitride 104 are formed on the wafer 100. Preferably, the pad oxide layer 102 is 15 nm thick and the pad nitride layer 104 is 172 nm thick. Shallow isolation trenches 106, 108, 110 and 112 are defined, preferably lithographically. Then, trenches 106,108, 110 and 112 are etched through pad oxide 102, pad nitride 104 to a depth of about 500 nm into the silicon wafer 100.

The preferred embodiment manufacturing process is a complementary 25 insulated gate field effect transistor (FET) process commonly referred to as CMOS and includes both normal FETs and higher voltage FETs and floating gate cell devices. Thus, both normal FETs and higher voltage FETs, referred to herein as NFETs & PFETs in areas 114, 116, HiV NFETs & HiV PFETs in areas 118 and 120, respectively. Floating gate cell devices in areas 122 are referred to herein as EEPROM cell. The cross-section of the Figures is intended to illustrate formation of all five device variations.

Thus, having defined device areas 114, 116, 118, 120 and 122, the shallow trenches 206, 108, 110 and 112 are filled with oxide, preferably TEOS, and the filled structure is annealed at 1000° C. for TEOS densification. Then, in FIG. 2B the pad nitride layer 104 is stripped, preferably using a hot phosphoric acid wet etch and the surface 124 is planarized.

Figure 2C:
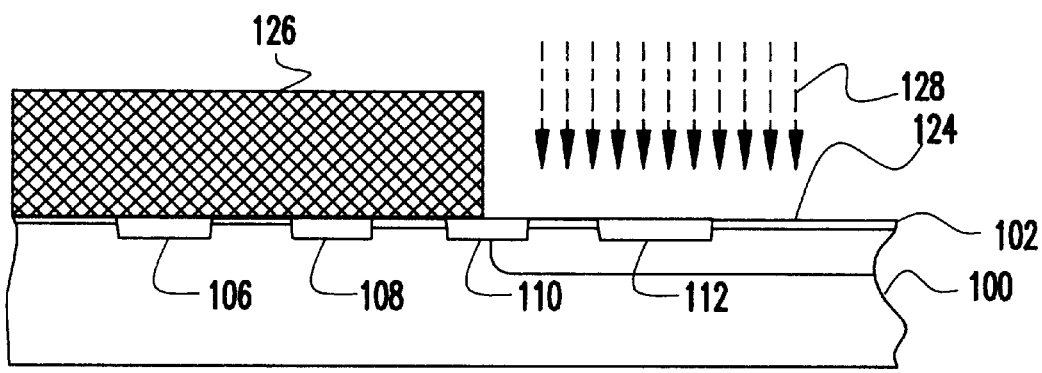

In FIG. 2C, high voltage p-wells, for HiV NFETs 118 and EEPROM cells 122 are defined. A mask 126 protects NFET areas 114 as well as PFET areas 116 and HiV PFET areas 120. Using a two-step implant as represented by arrows 128, the unmasked surface areas of silicon wafer 100 are implanted to a level sufficient for high voltage threshold tailoring. First, boron is implanted 128 at 195 KeV to a dopant level of $2.0 \times 10^{12}$ cm$^{-2}$, followed by BF$_2$ at 75 KeV to a dopant level of $8.0 \times 10^{12}$ cm$^{-2}$. After this two-step implant, the mask 126 is removed using a dry strip and the wafer is cleaned using a S/N/O clean (sulfuric nitric ozone clean) to re-expose the surface 124.

Figure 2D:
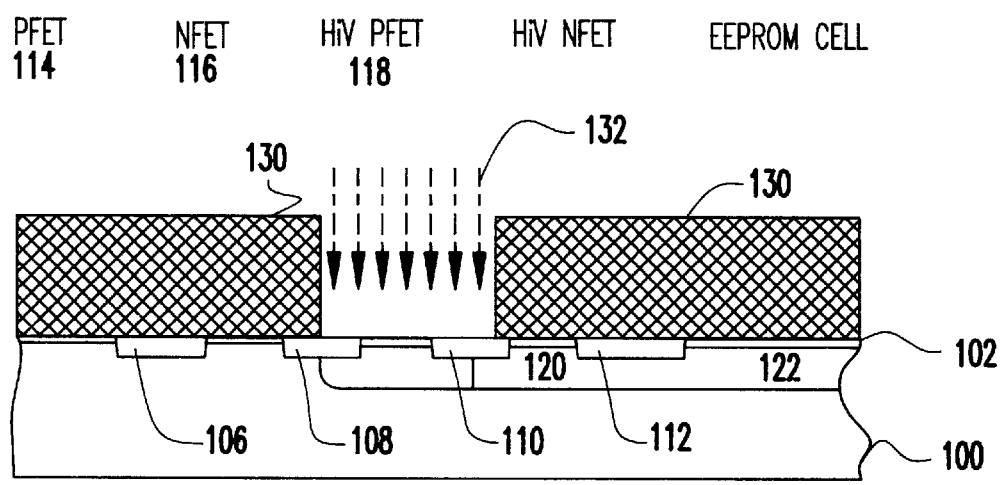

Next, in FIG. 2D, high voltage FET n-wells are formed for HiV PFETs 118. Again the surface 124 is masked 130 to protect normal PFET areas 116, normal NFET areas 114, HiV NFET areas 120 and EEPROM cells 122, while leaving HiV PFET areas 118 exposed. Like the high voltage p-wells, the high voltage n-wells are doped using a two-step doping as represented by arrows 132. First, arsenic is implanted at 1000 KeV to a dopant level of $4.0 \times 10^{13}$ cm$^{-2}$, followed by antimony at 140 KeV to a dopant level of $2.0 \times 10^{12}$ cm$^{-2}$. The resist 130 is stripped away using a dry strip and remaining pad oxide 102 is stripped from the surface 124. Thus, wafer preparation step 50 is complete.

Figure 3:
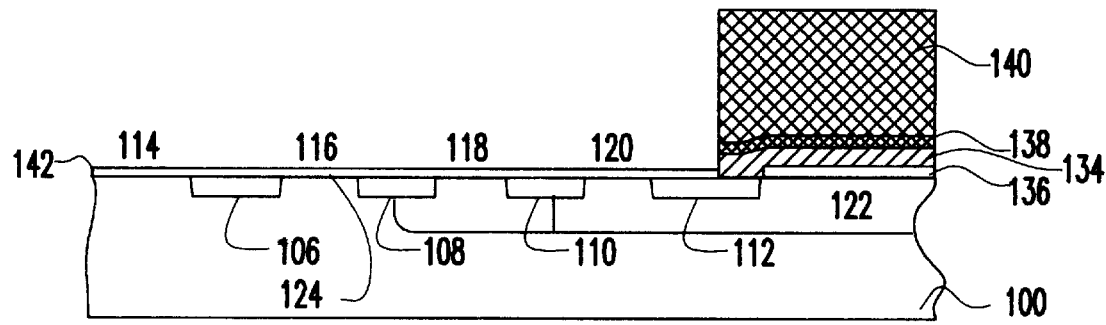
FIG. 3 show the step of forming a floating gate layer in cell areas.

Next, in step 52, as represented in FIG. 3, a floating gate layer 134 is formed in cell areas. First, a 9.0 nm tunnel oxide layer 136 is grown on the surface 124. Then, a 120.0 nm amorphous polysilicon floating gate layer 134 is grown on the tunnel oxide 136. The floating gate layer 134 is implanted with a suitable dopant and an oxide-nitride-oxide (ONO) layer 138 is formed on the polysilicon floating gate layer 134. Preferably, the ONO layer 138 is formed by forming a 9.0 nm dry oxide layer on the amorphous polysilicon floating gate layer 134, followed by deposition of an 8.5 nm layer of nitride and a subsequent 1.5–2.0 nm oxide layer. A mask pattern 140 is formed on the ONO layer 138 and the floating gate layer 134 is patterned by etching away exposed ONO and amorphous polysilicon. Remaining tunnel oxide on surface 124 is stripped away to re-expose the silicon surface 124 in device areas 114, 116, 118 and 120.

Figure 4A:
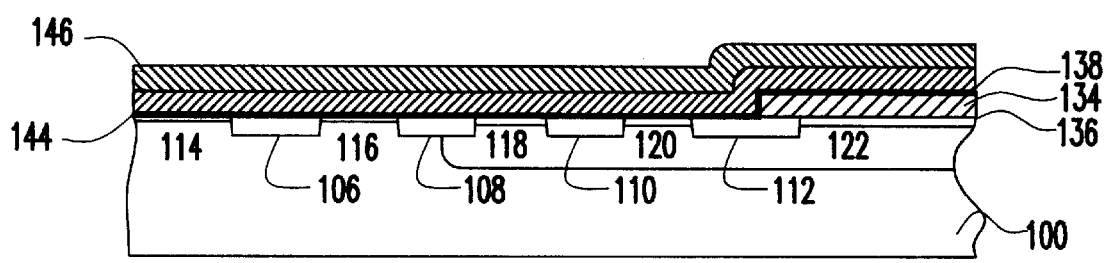
FIGS. 4A–4E show the step of forming a polysilicon high voltage gate layer.

Next, in step 54, as illustrated in FIGS. 4A–E, a high voltage device gate oxide layer 142 in FIG. 4A is formed on the bare surface 124. Then, a high voltage gate layer 144 of polysilicon is formed on the high voltage gate oxide layer. Preferably, the high voltage gate oxide layer is 23.5 nm thick and the polysilicon gate layer 144 is 200.0 nm thick. A thin, 4.0 nm, oxide layer (not shown) is formed on the polysilicon high voltage gate layer 144. A nitride layer 146, preferably 120.0 nm thick, is deposited on the thin oxide layer.

Figure 4B:
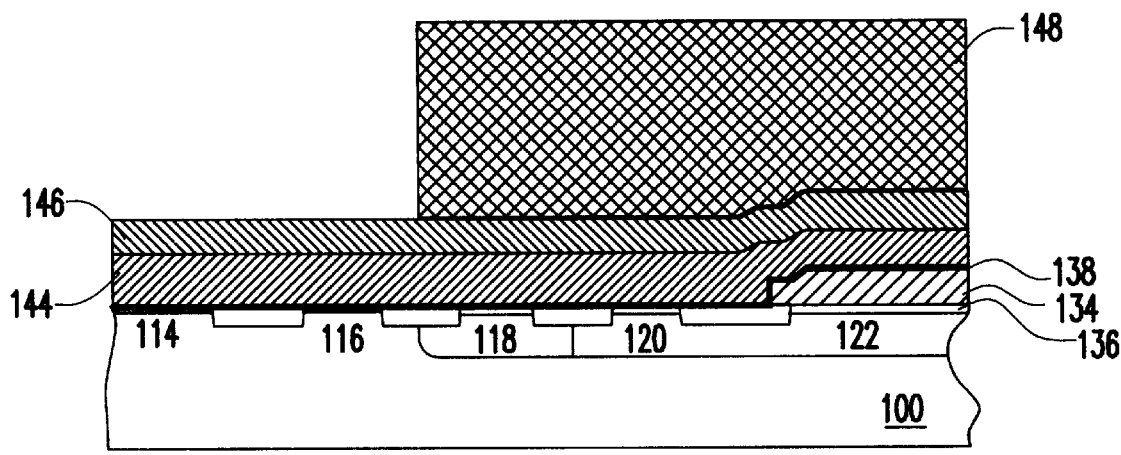
Figure 4C:
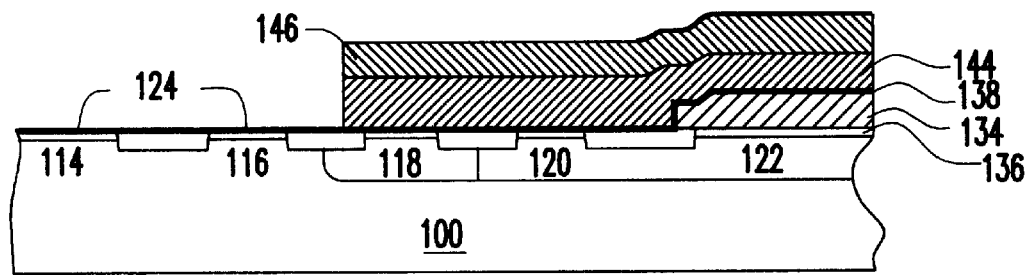
Figure 4D:
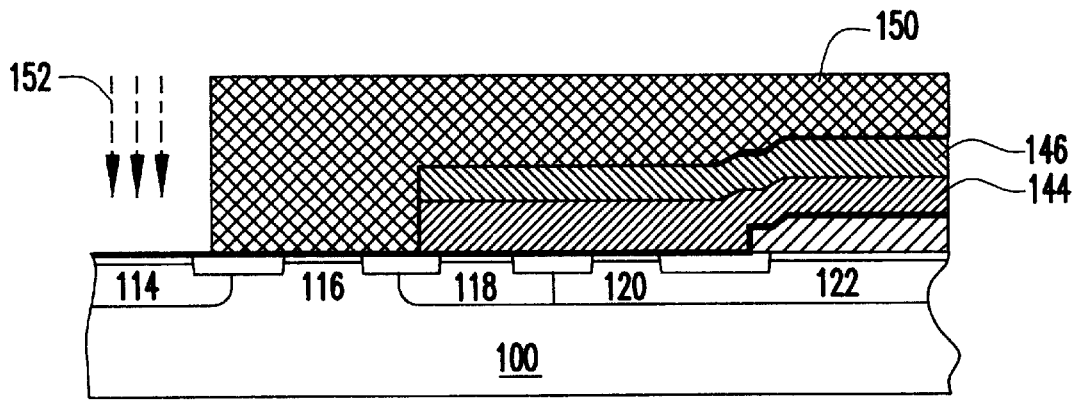
Figure 4E:
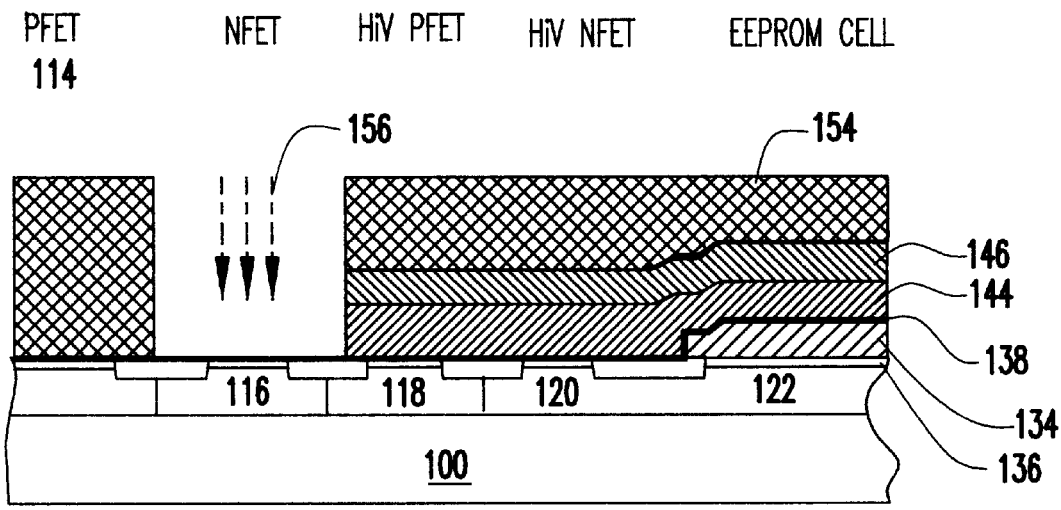

In FIG. 4B, a mask 148 is formed on nitride layer 146 over HiV PFET areas 118, HiV PFET areas 120 and EEPROM areas 122. Then, portions of polysilicon high voltage gate layer 144, thin oxide layer and nitride layer 146 are selectively removed from PFET areas 114 and NFET areas 116. Once the resist 148 is removed in FIG. 4C, the high voltage gate oxide layer is stripped away from the surface 124 in PFET areas 114 and NFET areas 116. This is followed by growing a temporary protective oxide layer (not shown), preferably 10.0 nm thick, in PFET areas 114 and NFET areas 116.

Next, normal voltage FET n-wells and p-wells are defined. So, in FIG. 4D, an n-well mask 150 is formed on the structure of FIG. 4C and the n-wells are implanted, as represented by arrows 152. The n-well mask 150 is stripped away and a p-well mask, 154 in FIG. 4B, is formed. The p-wells are implanted, as represented by arrows 156. Then, the p-well mask 154 is stripped away. The exposed surface is cleaned to remove the oxide layer and a gate oxide layer is formed. Preferably, the gate oxide is a 7.0 nm thick layer grown in N$_2$O.

Figure 5A:
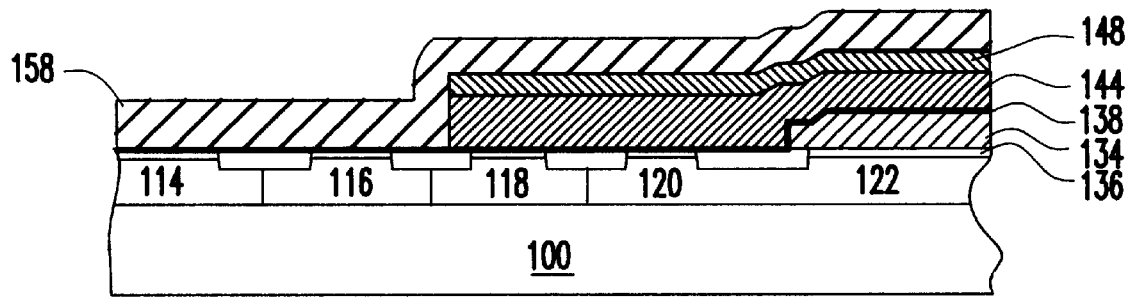
FIGS. 5A–C show the step of defining logic device gates.
Figure 5B:
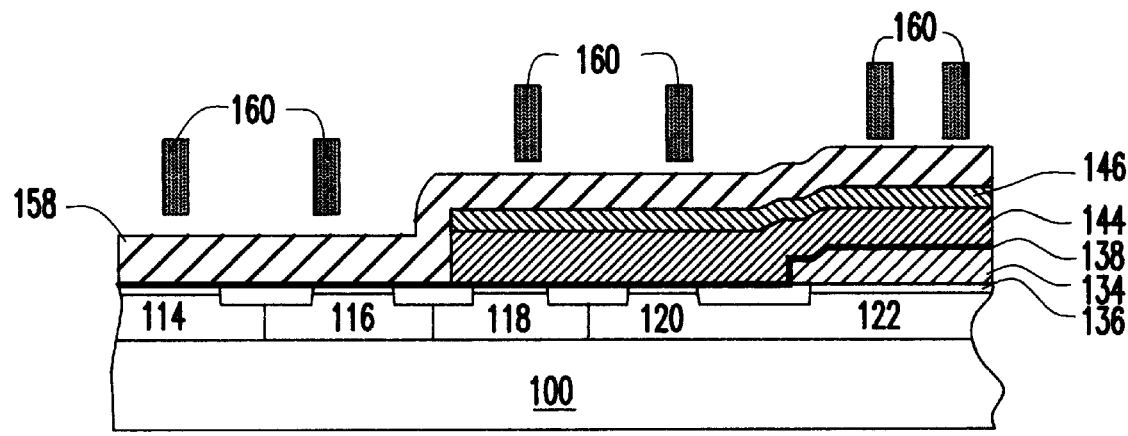
Figure 5C:
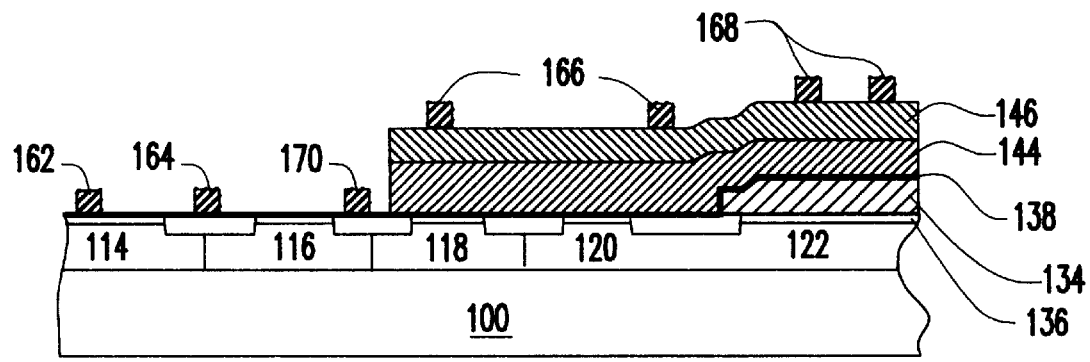

Then, in step 56 as represented in FIGS. 5A–C, logic device or normal FET gates are defined in areas 114, 116. In FIG. 5A, a gate layer 158 of polysilicon is formed conformally. Preferably, gate layer 158 is 200.0 nm thick and formed on the gate oxide layer. In FIG. 5B, a mask pattern 160 is formed on the conformal polysilicon gate layer 158 to define the gates of all of the devices 114, 116, 118, 120 and 122. Preferably, the gate mask pattern 160 is formed using a well known TEOS hard mask technique. The conformal polysilicon gate layer 158 is selectively removed so that, in FIG. 5C, PFET gates 162 and NFET gates 164 have been defined from the polysilicon gate layer 158. Additionally, a high voltage gate hard mask 166 and EEPROM gate hard mask 168 pattern is formed from the patterned polysilicon gate layer 158. Sidewall artifacts 170 remain along vertical edges.

Figure 6A:
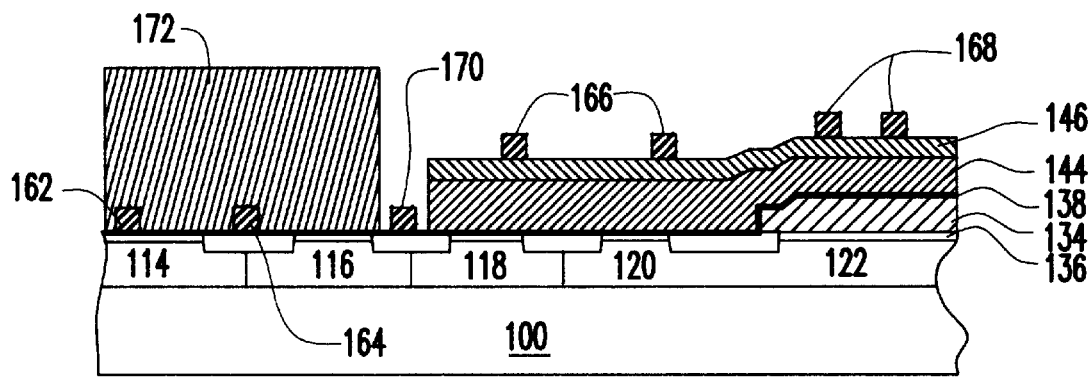
FIGS. 6A–B show the step of defining HiV gates and word lines.
Figure 6B:
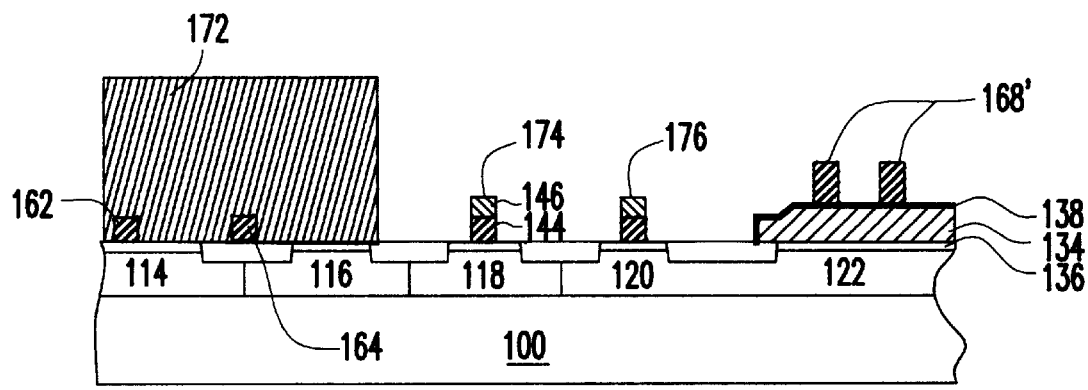

Next, in step 58 as represented in FIGS. 6A–B, HiV gates and word lines are defined. In FIG. 6A, PFET gates 162 and NFET gates 164 are masked 172 and a dry etch is applied to etch away exposed nitride 146, nitride remaining under mask pattern 160. This nitride etch is followed by a polysilicon etch, which removes masking polysilicon pattern 166, 168 and sidewall artifact 170 as it selectively removes high voltage gate layers 144 leaving, in FIG. 6B, HiV PFET gates 174 and HiV NFET gates 176 in and word line stacks 180 and 182 running the length of the EEPROM array, i.e., out of the page. As seen, HiV PFET gates 174 and HiV NFET gates 176 and EEPROM gates 168' are comprised of portions of high voltage gate layers 144, 146. At this point, the sidewall artifacts 170 have also been removed. Etching ends at the ONO layer 138 on floating gate layer 134.

Figure 7A:
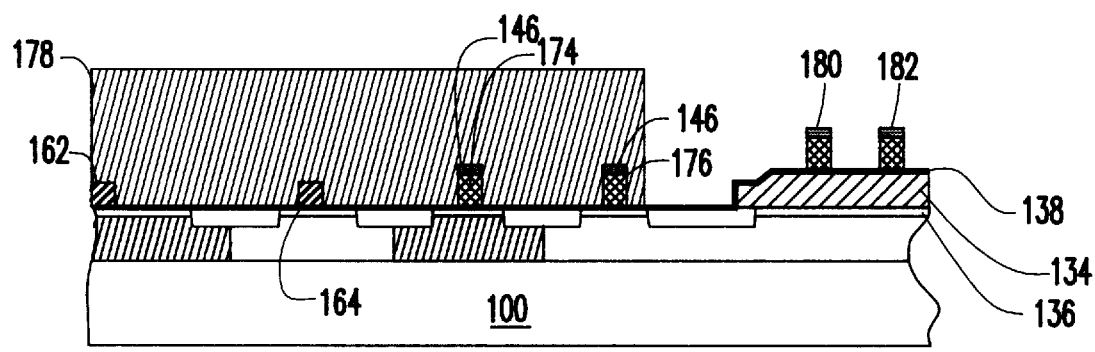
FIGS. 7A–B show the step of defining individual cell floating gates.
Figure 7B:
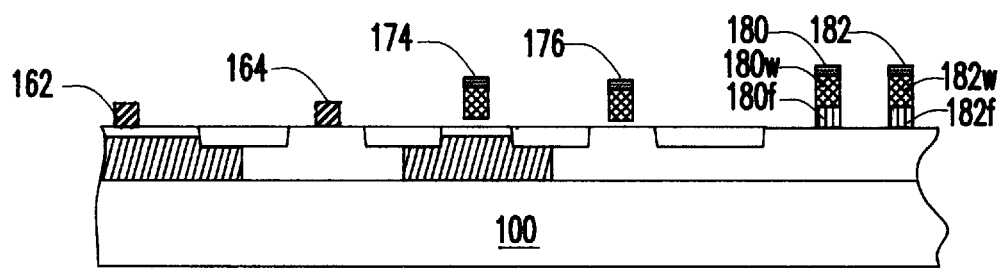

Then, in step 60, as represented in FIGS. 7A–B, individual cell floating gates are defined. Thus, FIG. 7A illustrates the final floating gate definition step, wherein defined PFET gates 162, NFET gates 164, HiV PFET gates 174 and HiV NFET gates 176 masked 178. Exposed portions of ONO layer 138 are etched to re-expose unmasked portions of floating gate layer 134, which is subsequently selectively etched leaving word line stacks 180, 182 defining EEPROM cells in FIG. 7B. Each EEPROM gate cell includes a floating gate 180f or 182f and a word line 180w or 182w. After defining PFET gates 162, NFET gates 164, HiV PFET gates 174, HiV NFET gates 176, word lines 180w, 182w, and floating gates 180f and 182f, source and drains diffusions may be implemented.

Figure 8A:
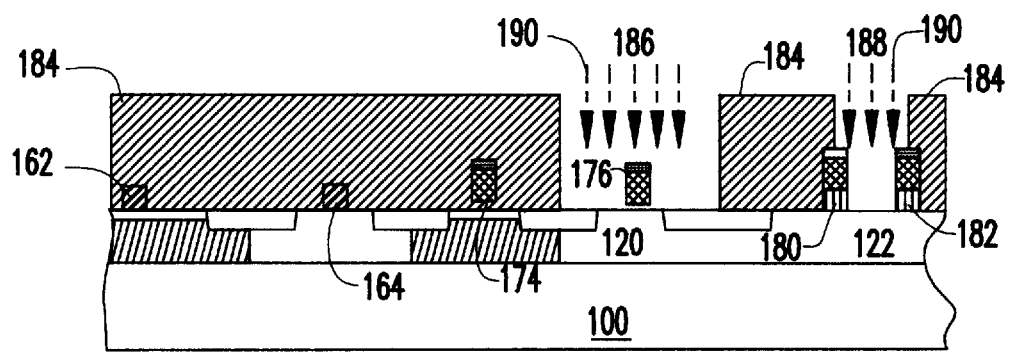
FIGS. 8A–8E show the step of implanting device source/drain diffusions.
Figure 8B:
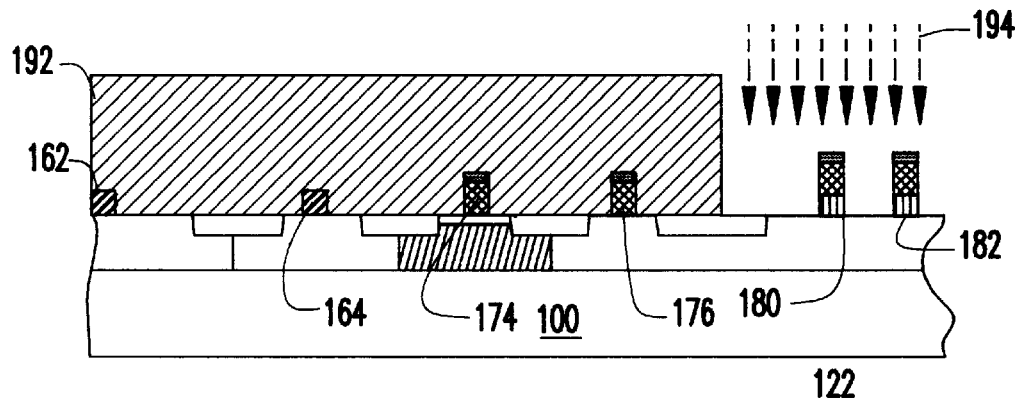

In FIGS. 8A–E device source/drain diffusions are implanted. In FIG. 8A, a diffusion mask 184 is formed on the structure of FIG. 7B to define areas for high voltage diffusion implant. Windows 186 and 188 are opened through the mask 184, leaving HiV NFET areas 120 exposed and windows 188 are opened leaving bit line contact areas exposed in EEPROM areas 122. Exposed areas are implanted (through the windows 186, 188) with phosphorous, as represented by arrows 190, to lightly dope both HiV NFET diffusions in areas 120 and EEPROM cell drain diffusions in bit line contacts in EEPROM areas 122. Then, the mask 184 is stripped away. Layer 146 has been stripped from word lines 180, 182 and HiV gates 174 176 by a hot phosphoric acid wet etch. In FIG. 8B, mask 192 is formed, leaving only the EEPROM areas 122 exposed. Then, EEPROM cell source/drain diffusions are implanted with Arsenic in EEPROM areas 122.

Figure 8C:
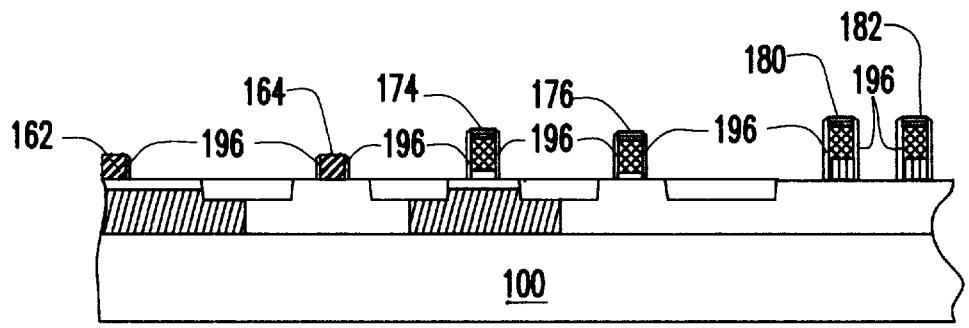

Having implanted the EEPROM cells and HiV NFETs, in FIG. 8C, nitride sidewalls 195 are formed on each of the gates 162, 164, 174 and 176 and word line stacks 180 and 182. Preferably, the nitride sidewalls 195 are formed by depositing a conformal layer of nitride, followed by a directional etch, e.g., a reactive ion etch (RIE), to remove nitride from horizontal surfaces.

Figure 8D:
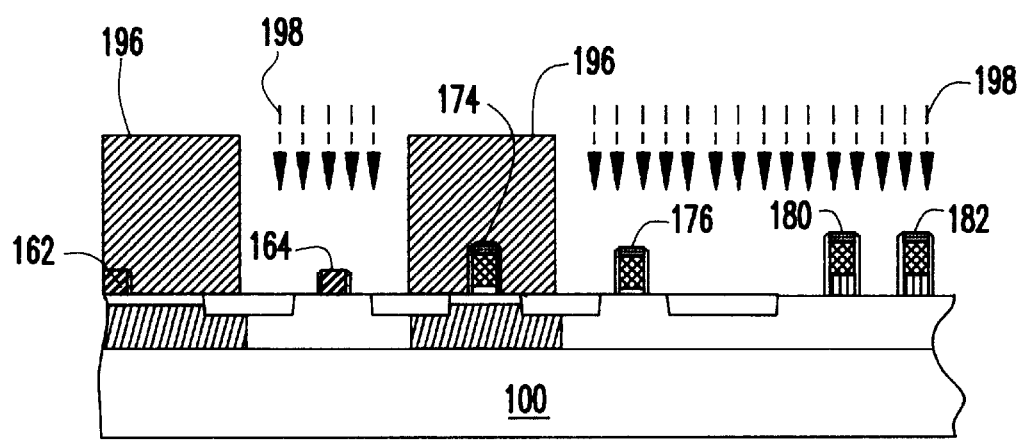
Figure 8E:
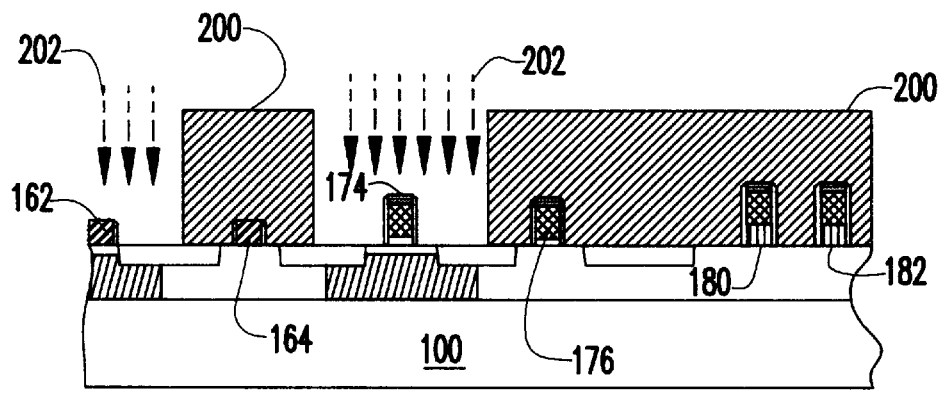

Next, in FIG. 8D, a mask 196 masks PFETs 114 and HiV PFETs 118 and the NFET devices are completed with a final n-type implant, as represented by arrows 198. During the implant NFET 198 n-type source/drain diffusions are defined simultaneously with doping NFET gates 164 and HiV NFET gates 176. Mask 196 is stripped away and in FIG. 8E, mask 200, which is essentially a negative of mask 196, masks n-type regions, while PFET areas 114 and HiV PFET areas 118 are implanted with germanium and boron as represented by arrows 202, to define p-type source drain diffusions and dope gates 162, 174.

Figure 9:
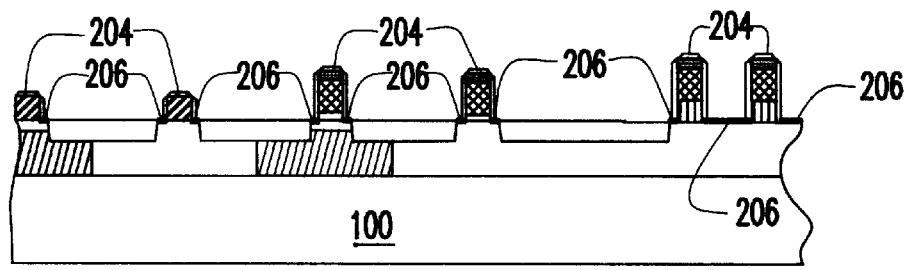
FIG. 9 shows the step of forming nitride on the device structure of FIG. 8E.
Figure 10:
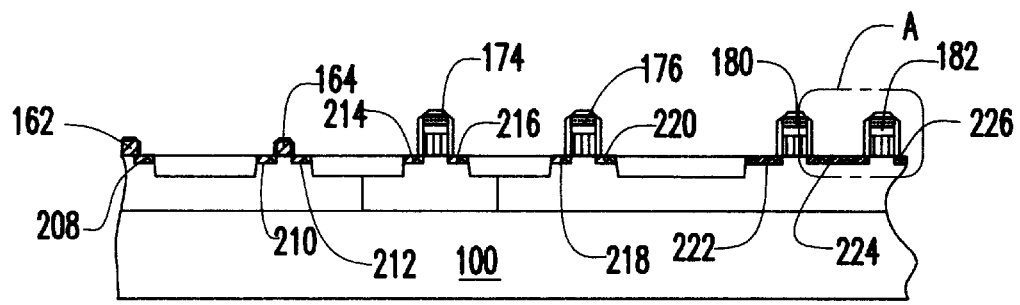
FIG. 10 shows the wafer after annealing to diffuse implanted source/drain dopant.

Next, in step 64 as represented in FIGS. 9 and 10, silicide is formed on the device structure. First, the mask 200 is stripped off of the wafer, preferably using a dry strip and, the wafer is cleaned. The wafer is annealed, preferably using a rapid thermal anneal, to activate dopants and repair any surface damage from dopant implants. A titanium layer is deposited, preferably using a sputter deposition technique. The titanium layer is annealed in nitrogen at to form Titanium Silicide on exposed regions. Then, unreacted Titanium is stripped from away, followed by a silicide transformation anneal, which leaves gates 162, 164, 174 and 176 and word line stacks 180 and 182 capped with $TiSi_2$ 204. Source/drain areas are also silicided. From this point, processing would continue with conventional back end of the line processing as is well known in the art.

Figure 11A:
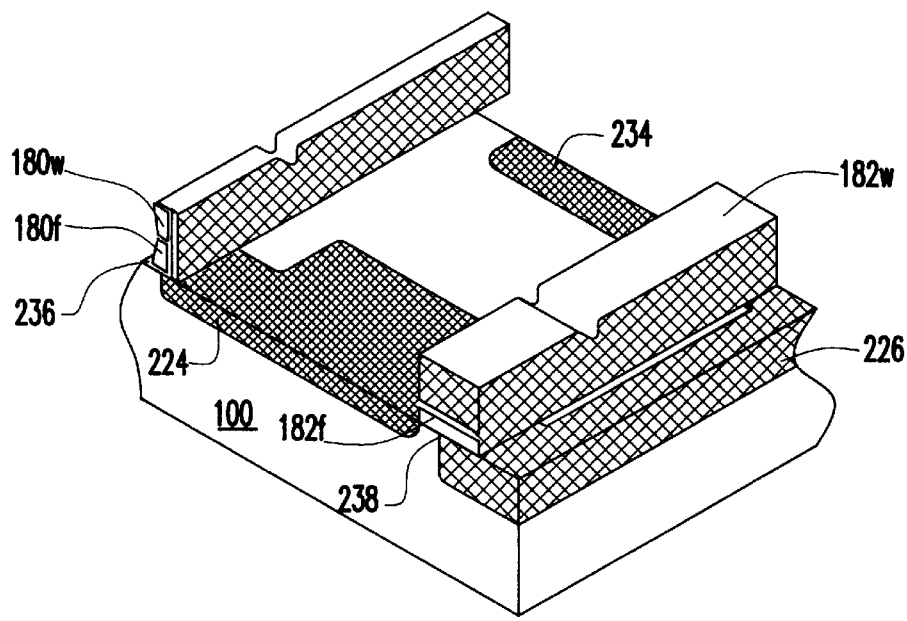
FIG. 11A is an expanded plan view of EEPROM cell area A in FIG. 10.
Figure 11B:
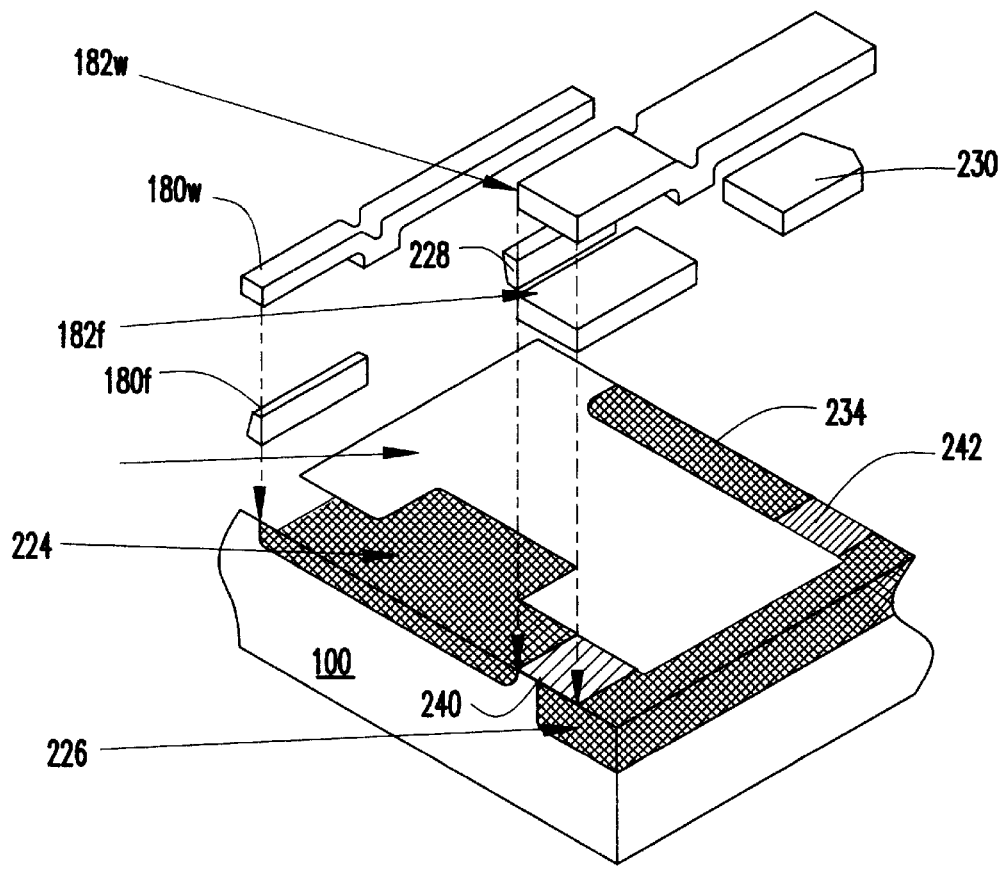
FIG. 11B is an exploded view of the EEPROM cells in area of FIG. 11A

FIG. 11A is an expanded plan view of EEPROM cell area A in FIG. 10. FIG. 11B is an exploded view of the EEPROM cells of FIG. 11A. Portions of four cells are shown in FIGS. 11A–B as represented by floating gate 182*f* and floating gate portions 180*f*, 228 and 230. Word line 180 is capacitively coupled to floating gates 180*f* and 228, while word line 182 is capacitively coupled to floating gates 182*f* and 230. Each bit line diffusion 224, 232 is shared by four cells, only two of which are shown for each bit line diffusion 224, 234 of FIGS. 11A–B. A source line 222, 226 runs parallel to and, provides the source voltage for cells on one Word line 180*w*, 182*w*, respectively. Tunnel oxide 236, 238 between the floating gates 180*f*, 182*f*, 228, 230 and the surface 124 facilitates cell programming.

During erase, previously stored (written) electrons on the floating gate 180*f*, 182*f*, 228, 230 tunnel to source line 222, 226 through the tunnel oxide 236, 238. During a write, electrons are injected from the channel 240, 242 to the floating gate 180*f*, 182*f*, 228, 230.

During a read operation, the FET of the floating gate will either go to the "ON" state or stay in the "OFF" state when the wordline is selected, depending on the electron charge stored in the floating gate. Thus, cells such as in FIGS. 11A–B may be programmed, read, erased and reprogrammed by applying voltages to cell terminals as set forth in the table below.

|  | READ | WRITE | ERASE |
|---|---|---|---|
| Bit line | 1v | "0" = 5V<br>"1" = 0V | floating |
| Word line | 3V | 10v | 0v |
| Source line | 0v | 0v | 10v |

Having thus formed the preferred embodiment integrated circuit chip, including logic and an embedded non-volatile array, e.g., a microprocessor with embedded flash memory, the triple polysilicon process of the preferred embodiment provides an integrated circuit logic chip with an embedded EPROM array without suffering the dilatory effects of prior art semiconductor processes.

While the invention has been described in terms of preferred embodiments, those skilled in the art will recognize that the invention can be practiced with modification within the spirit and scope of the appended claims.

We claim:

1. A method of forming an integrated circuit chip, said integrated circuit chip including a plurality of logic circuits having an embedded non-volatile random access memory (NVRAM) array, said method comprising the steps of
    a) defining device areas on a semiconductor wafer, said device areas including array areas, first device type areas and second device type areas;
    b) selectively forming a floating gate layer on said semiconductor wafer in said array areas;
    c) selectively forming a first gate layer on said semiconductor wafer in said first device areas and on said floating gate layer;
    d) forming a second gate layer on said semiconductor wafer in said second device type areas and on said first gate layer;
    e) defining device gates in each of said areas; and
    f) forming source and drain diffusions at said defined device gates.

2. The method of claim 1, wherein the step (a) of defining device areas comprising:
    1) forming isolation trenches in a surface of a semiconductor wafer; and
    2) forming isolation wells in said array areas and said first device type areas.

3. The method of claim 2, wherein the semiconductor wafer is a silicon wafer and the step (b) of selectively forming the floating gate layer comprises:
    1) forming a tunnel oxide on said surface;
    2) forming a polysilicon layer on said tunnel oxide; and
    3) etching said polysilicon layer, said polysilicon layer being removed from said first device type areas and said second device type areas.

4. The method of claim 3, wherein the step (b) of selectively forming the floating gate layer further comprises, before the step (3) of etching the polysilicon layer, the step of:
    2A) forming an oxide-nitride-oxide (ONO) layer on said polysilicon layer.

5. The method of claim 3, wherein the step (c) of selectively forming the first gate layer comprises the steps of:
    1) forming a first gate oxide layer on said silicon surface;
    2) forming a polysilicon layer on said first gate oxide layer; and 3) etching said polysilicon layer, said polysilicon layer being removed from said second device type areas.

6. The method of claim 5 wherein the step (c) of selectively forming the first gate layer further comprises, before the step (3) of etching the polysilicon layer, the step of:

2A) forming an oxide and nitride layer on said polysilicon layer.

7. The method of claim 5, wherein the step (d) of forming the second gate layer comprises the steps of:

1) forming isolation wells in said second device type areas;

2) forming a second gate oxide layer on said silicon surface; and 3) forming a polysilicon layer on said second gate oxide layer.

8. The method of claim 7, wherein the step (e) of defining device gates layer comprises the steps of:

1) patterning said second gate layer, said patterned second gate layer defining gates in said second device type areas and a mask pattern in said first device type areas and said array areas;

2) defining first gates in said first device type areas and word lines in said array areas; and 3) defining floating gates in said array areas.

9. The method of claim 8, wherein the first gate layer includes a dielectric layer on said polysilicon layer and, the step (2) of defining first gates and word lines comprises the steps of:

A) forming a protective layer over said defined second gates;

B) removing said dielectric layer, said polysilicon layer in said first gate layer being exposed between shapes of said mask pattern; and C) etching said exposed polysilicon layer.

10. The method of claim 9, wherein the floating gate layer includes a dielectric layer on said polysilicon layer and, the step (3) of defining the floating gates comprises the steps of:

A) forming a protective layer over said defined first gates and second gates;

B) removing said dielectric layer, said polysilicon layer in said floating gate layer being exposed between said word lines; and C) etching said exposed polysilicon layer.

11. The method of claim 10, wherein the step (f) of forming source and drain diffusions comprises the steps of:

1) implanting dopant into sourte and drain areas;

2) diffusing said implanted dopant;

3) forming a nitride layer on said defined gates and said implanted source and drain areas;

4) implanting and diffusing said standard logic FETs; and 5) forming a silicide on said defined gate and said implanted source and drain area.

12. The method of claim 11, wherein said tunnel oxide is grown to a thickness of 9.0 nm, said first gate oxide is grown to a thickness of 23.5 nm and said second gate oxide is grown to a thickness of 7.0 nm.

* * * * *